United States Patent [19]
Blouke et al.

[11] Patent Number: 6,072,204
[45] Date of Patent: Jun. 6, 2000

[54] THINNED CCD

[75] Inventors: Morley M. Blouke; Taner Dosluoglu, both of Portland, Oreg.

[73] Assignee: Scientific Imaging Technologies, Inc., Tigard, Oreg.

[21] Appl. No.: 08/881,714

[22] Filed: Jun. 23, 1997

[51] Int. Cl.[7] .................... H01L 27/148; H01L 29/768
[52] U.S. Cl. .................... 257/231; 257/232; 257/233; 257/447; 257/448; 438/59; 438/60
[58] Field of Search .................... 257/447, 448, 257/231, 232, 233; 438/59, 60

[56] References Cited

U.S. PATENT DOCUMENTS

| | | | |
|---|---|---|---|
| 4,724,470 | 2/1988 | Van Santen et al. | 357/24 |
| 4,923,825 | 5/1990 | Blouke et al. | 437/53 |
| 4,946,716 | 8/1990 | Corrie | 427/289 |
| 5,255,099 | 10/1993 | Orihara | 358/213.23 |
| 5,393,997 | 2/1995 | Fukusho et al. | 257/232 |
| 5,631,702 | 5/1997 | Miwada | 348/272 |
| 5,661,317 | 8/1997 | Jeong | 257/225 |
| 5,716,867 | 2/1998 | Kim | 437/53 |

*Primary Examiner*—William Mintel
*Attorney, Agent, or Firm*—Smith-Hill and Bedell

[57] ABSTRACT

An integrated circuit device structure comprises a semiconductor plateau containing an active region subjacent its front side, an electrode structure at the front side of the plateau, and an insulating layer surrounding the semiconductor plateau. A front side bus at the front side of the insulating layer is connected to the electrode structure. The front side bus extends over an elongate aperture in the insulating layer and is connected through the aperture to a back side bus over substantially the entire length of the front side bus.

10 Claims, 3 Drawing Sheets

THINNED CCD

BACKGROUND OF THE INVENTION

This invention relates to a method of fabricating a thinned CCD.

A charge-coupled device (CCD) may be made by processing a silicon die of p conductivity using conventional MOS technology to form a buried channel of n conductivity in an active region beneath the front side of the die (the side through which the die is processed). The channel is resolved into a linear array of like elementary zones by a clocking electrode structure which is composed of gate electrodes and overlies the front side of the die, and by application of selected potentials to the gate electrodes, a charge packet present in a given elementary zone of the channel may be advanced through the linear array of elementary zones, in the manner of a shift register, and discharged from the channel. In a multi-phase CCD, the gate electrodes are organized as multiple sets and different phases of a multi-phase clock signal are applied to the respective sets of gate electrodes.

Charge may be generated in the channel photoelectrically. Thus, if electromagnetic radiation enters the buried channel, it may cause generation of conduction electrons, and these conduction electrons may be confined in one of the elementary zones to form a charge packet.

A CCD may be used to generate an electrical signal representative of the distribution of light intensity over the active region of the CCD. In such an imaging CCD, there may be multiple imaging channels extending parallel to one another and each connected at one end to a common readout channel which extends perpendicular to the imaging channels. Charge packets are generated in the elementary zones or pixels of the imaging channels during an integration interval. Subsequently, during a readout interval, the charge packets are transferred from the imaging channels into the readout channel and the charge packets are transferred serially through the readout channel to an output amplifier.

A known method of fabricating a three-phase imaging CCD will now be described with reference to FIGS. 3–6.

FIG. 3 shows a silicon die 2 that has been processed in conventional fashion to form an active region 4 which extends partly into the die from the front side 6 thereof. The active region contains the imaging channels and the readout channel, but the channels are not shown in FIG. 3. The active region 4 is surrounded by a thick layer of field oxide 8. There are several apertures 10 (only one of which is shown in FIG. 3) in the field oxide. There is a thin layer of gate oxide (not shown in FIG. 3) over the die in the active region 4 and in the apertures 10.

Referring to FIG. 4, the clocking electrode structure includes three sets of polysilicon conductor strips $12_1$, $12_2$ and $12_3$, corresponding respectively to the three phases of the clock signal used to operate the CCD. The conductor strips $12_1$, $12_2$, and $12_3$ include respective gate electrodes $14_1$, $14_2$, and $14_3$ (FIG. 6) which extend over the thin oxide 16, crossing the channels that are influenced by the gate Each conductor strip 12 includes a gate extension 18 (FIG. 5) which extends some distance over the field oxide. The conductor strips 12 of the three sets are formed sequentially, by depositing and patterning three successive layers of polysilicon, and the three deposits of polysilicon are referred to as the first, second and third levels, in accordance with the order in which they are deposited. Referring to FIGS. 4 and 5, the first level polysilicon also defines a polysilicon bus 20 which is formed on the field oxide 8 and interconnects the conductor strips $12_1$ of the first level polysilicon. The conductor strips $12_2$ of the second level polysilicon partially overlap the conductor strips $12_1$ of the first level polysilicon, but are not connected by a bus formed by the second level polysilicon. Similarly the conductor strips $12_3$ of the third level polysilicon partially overlap the conductor strips $12_1$ and $12_2$ but are not connected by a bus formed by the third level polysilicon.

Referring to FIG. 5, discrete islands 22 of polysilicon are deposited over the field oxide near the periphery of the die and extend into the apertures 10 in the field oxide.

When the polysilicon is initially deposited and patterned, it is non-conductive. Conductivity is imparted to the polysilicon conductor strips 12, the polysilicon bus 20 and the polysilicon islands 22 by doping with a donor dopant, such as phosphorus. The doping of all three levels takes place simultaneously, after all three levels of polysilicon have been deposited and patterned. In order to ensure that the conductor strips 12 and the bus 20 are electrically continuous, it is necessary to ensure that a conductor of an upper level does not cover the entire width of a conductor of a lower level and thereby mask the conductor of the lower level from the dopant source over its entire width. Consequently, the conductor strips of the second and third levels terminate short of the bus 20 so that they will not mask the bus 20. This is also why the second and third levels do not include buses since a second or third level bus would cover a conductor strip 12 of at least the first level over its entire width.

After the three levels of polysilicon have been deposited and doped, a layer 30 of reflow glass is deposited over the upper surface of the device, leaving portions of the polysilicon bus 20, terminal portions of the second and third level polysilicon conductor strips $12_2$ and $12_3$ and the polysilicon islands 22 exposed. Metal is deposited over the reflow glass to provide first, second and third buses $32_1$, $32_2$ and $32_3$. The first metal bus $32_1$ overlies the polysilicon bus 20 and is connected thereto by metal vias $34_1$ extending through apertures in the reflow glass. The second metal bus $32_2$ extends parallel to the first metal bus and is connected to the individual conductor strips $12_2$ of second level polysilicon by metal vias $34_2$ extending through apertures in the reflow glass. Similarly, the third metal bus $32_3$ extends parallel to the first metal bus and is connected to the conductor strips $12_3$ of third level polysilicon by metal vias $34_3$. Each of the metal buses 32 has a connection branch 36 extending outward to one of the polysilicon islands 22.

An interface layer 38 is deposited over the front side of this structure and a support 40 made of borosilicate glass is attached to the interface layer. The interface layer 38 accommodates differential thermal expansion between the silicon die 2 and the borosilicate glass support 40. The silicon die is then thinned from its back side to a thickness in the range from about 10 to 20 μm. After thinning, the active region of the thinned die is masked and portions of the substrate outward of the active region are completely removed, leaving a silicon plateau 2' containing the active region surrounded by a plain of field oxide 8. In FIG. 5, the topography of the plateau and plain are inverted since, by convention, the front side of the structure is shown upward. The gate oxide is removed from the apertures 10 in the field oxide and aluminum bonding pads 42 are deposited into the apertures 10 and make contact with the polysilicon islands 22. The aluminum bonding pads are connected by wire bonding to external circuitry for driving the gate electrodes. See U.S. Pat. No. 4,923,825.

An important figure of merit of an imaging CCD is the charge transfer efficiency or CTE, which is a measure of the efficiency with which a charge packet which is formed in a given pixel of an imaging channel is transferred to the output amplifier at a given readout rate. In order to achieve a high value for the CTE, it is necessary that the relative potentials in the imaging channels or in the readout channel, induced by changes in the relative potential of the gate electrodes of the different phases, change in accurately predetermined manner and in accurately timed relationship.

The time required to charge and discharge the gate structure, so as to effect a change in potential in an imaging channel or the readout channel, depends on the resistance of the path from the bond pad to the gate electrodes. For a high speed application, where pixel data is read at multiple frames per second, this overhead time can be a significant part of the clock period and by decreasing this overhead time, it may be possible to increase the data rate without loss of CTE.

Owing to constraints in layout, the lengths of the connection branches from the metal buses 32 to the polysilicon islands 22 may be significantly different for the three metal buses respectively, and the connection branches may be connected to the respective metal buses at locations which are spaced apart along the metal buses: the connection branch for phase 1 may be connected to the metal bus $32_1$ at one end of the bus, the branch for phase 2 may be connected to the bus $32_2$ at the opposite end, and the branch for phase 3 may be connected to the bus $32_3$ midway between the two ends.

The metal buses 32 and their connection branches 36 are made of a refractory metal because of the high temperatures involved in forming the interface layer and the glass ceramic substrate. Refractory metals typically have substantially higher electrical resistivity than non-refractory metals that are commonly used in integrated circuit fabrication, such as aluminum. For example, the sheet resistivity of the refractory metal used in the conventional structure may be on the order of 5 ohms per square whereas the sheet resistivity of aluminum is 0.05 ohms per square. Some of the metal leads from the bond pads to the gates can be more than 100 squares, and accordingly the sheet resistivity of the refractory metal can have a substantial effect on device speed.

In a practical implementation of the CCD described with reference to FIGS. 3–6, the length of the metal bus is significantly different for the three phases. Consequently, at high clocking rates it is possible for the pulses of the different phases to be mistimed and for the charge transfer efficiency in the parallel section and/or the serial section to be impaired.

SUMMARY OF THE INVENTION

In accordance with a first aspect of the invention there is provided a method of fabricating an integrated circuit device having multiple electrodes, comprising (a) providing a semiconductor die having a front side and a back side and containing an active region subjacent the front side, there being a field region of the front side of the die adjacent the active region, (b) forming a first level electrode structure and a first level bus over the front side of the die, wherein the first level gate electrode structure extends over the active region of the die and the first level bus extends over the field region of the front side of the die, (c) forming a second level electrode structure and a second level bus over the front side of the die, wherein the second level electrode structure extends over the active region of the die and the second level bus extends over the field region of the front side of the die, and (d) making electrical contact to the buses along substantially the entire length of each bus from beneath the bus.

In accordance with a second aspect of the invention there is provided a method of fabricating an integrated circuit device having multiple electrodes, comprising (a) providing a semiconductor die having a front side and a back side and containing an active region subjacent the front side, there being a field region of the front side of the die adjacent the active region, (b) forming an array of first level electrodes and a first level interconnect means over the front side of the die, wherein the first level electrodes extend over the active region of the die and the first level interconnect means is connected to each of the first level electrodes and extends over a first selected range of the field region of the front side of the die perpendicular to the extent of the first level electrodes, (c) forming an array of second level electrodes and a second level interconnect means over the front side of the die, wherein the second level electrodes extend over the active region of the die parallel to the first level gate electrodes and the second level interconnect means is connected to each of the second level electrodes and extends over a selected range of the field region of the front side of the die and perpendicular to the extent of the second level electrodes, (d) forming a first metal bus at the back side of the first level interconnect means, the first metal bus extending over said first selected range and providing electrically continuous connection among the first level electrodes by way of the first level interconnect means, and (e) forming a second metal bus at the back side of the second level interconnect means, the second metal bus extending continuously over substantially the entire extent of said second selected range and providing electrically continuous connection among the second level electrodes by way of the second level interconnect means.

In accordance with a third aspect of the invention there is provided an intermediate structure in fabrication of an integrated circuit device, said intermediate structure comprising a semiconductor die having front and back sides and incorporating an active region subjacent the front side and within a boundary on the front side of the die, a first level electrode structure and a first level bus over the front side of the die, wherein the first level electrode structure extends over the active region of the die and the first level bus extends over the field region of the front side of the die, and a second level electrode structure and a second level bus over the front side of the die, wherein the second level electrode structure extends over the active region of the die and the second level bus extends over the field region of the front side of the die.

In accordance with a fourth aspect of the invention there is provided an integrated circuit device structure comprising a semiconductor plateau having front and back sides and containing an active region subjacent the front side, an insulating layer surrounding the semiconductor plateau at the front side of the plateau and having a front side and a back side and being formed with at least first and second elongate apertures, a first level electrode structure at the front side of the plateau, a first level bus at the front side of the insulating layer and connected to the first level electrode structure, the first level bus extending over the first elongate aperture, a second level electrode structure at the front side of the plateau, a second level bus at the front side of the insulating layer and connected to the second level electrode structure, the second level bus extending over the second elongate aperture, a first metal bus at the back side of the insulating layer and connected to the first level bus through the first aperture over substantially the entire length of the first level bus, and a second metal bus at the back side of the insulating layer and connected to the second level bus through the second aperture over substantially the entire length of the second level bus.

In accordance with a fifth aspect of the invention there is provided an integrated circuit device structure comprising a semiconductor plateau having front and back sides and containing an active region subjacent the front side, an insulating layer surrounding the semiconductor plateau at the front side of the plateau and having a front side and a back side and being formed with at least one elongate aperture, an electrode structure at the front side of the plateau, a front side bus at the front side of the insulating layer and connected to the electrode structure, the front side bus extending over the elongate aperture, and a back side bus at the back side of the insulating layer and connected to the front side bus through the aperture over substantially the entire length of the front side bus.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
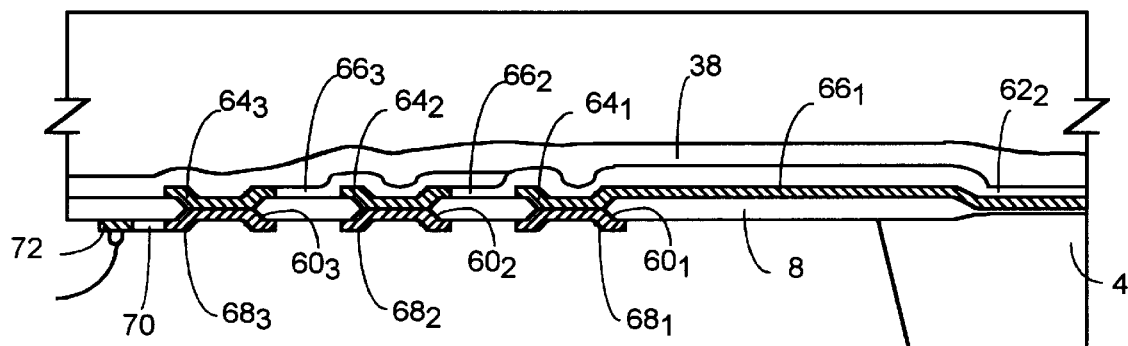
FIG. 1 is a partial sectional view of a charge-coupled device that has been fabricated in accordance with the present invention.
Figure 2:
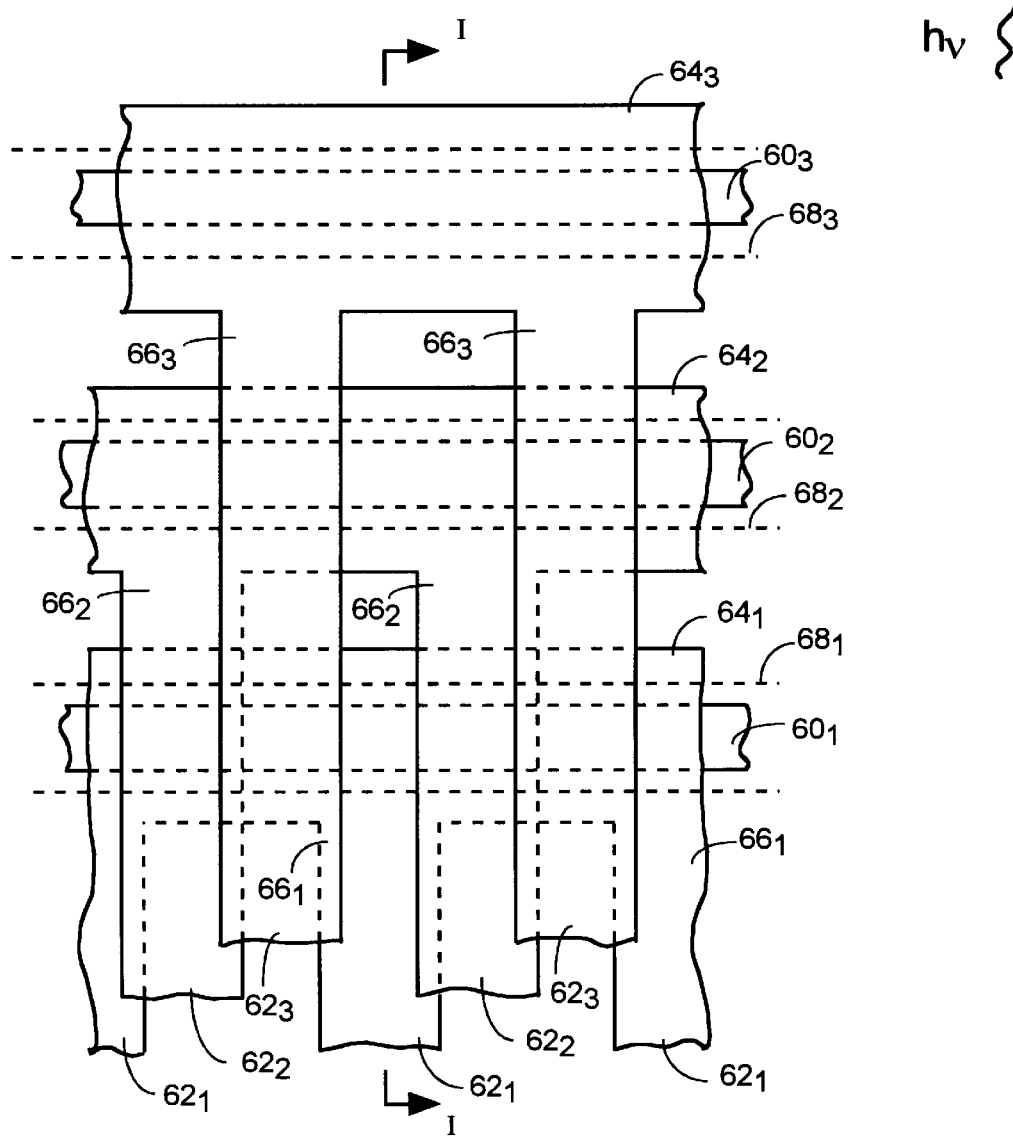
FIG. 2 is a top plan view of the CCD at an earlier stage in fabrication.
Figure 3:
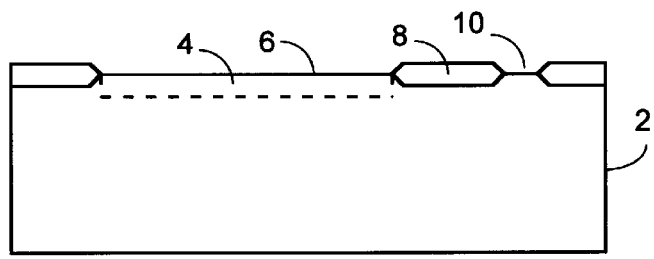
FIG. 3 is a part sectional view of a CCD in accordance with the prior art partway through fabrication.
Figure 4:
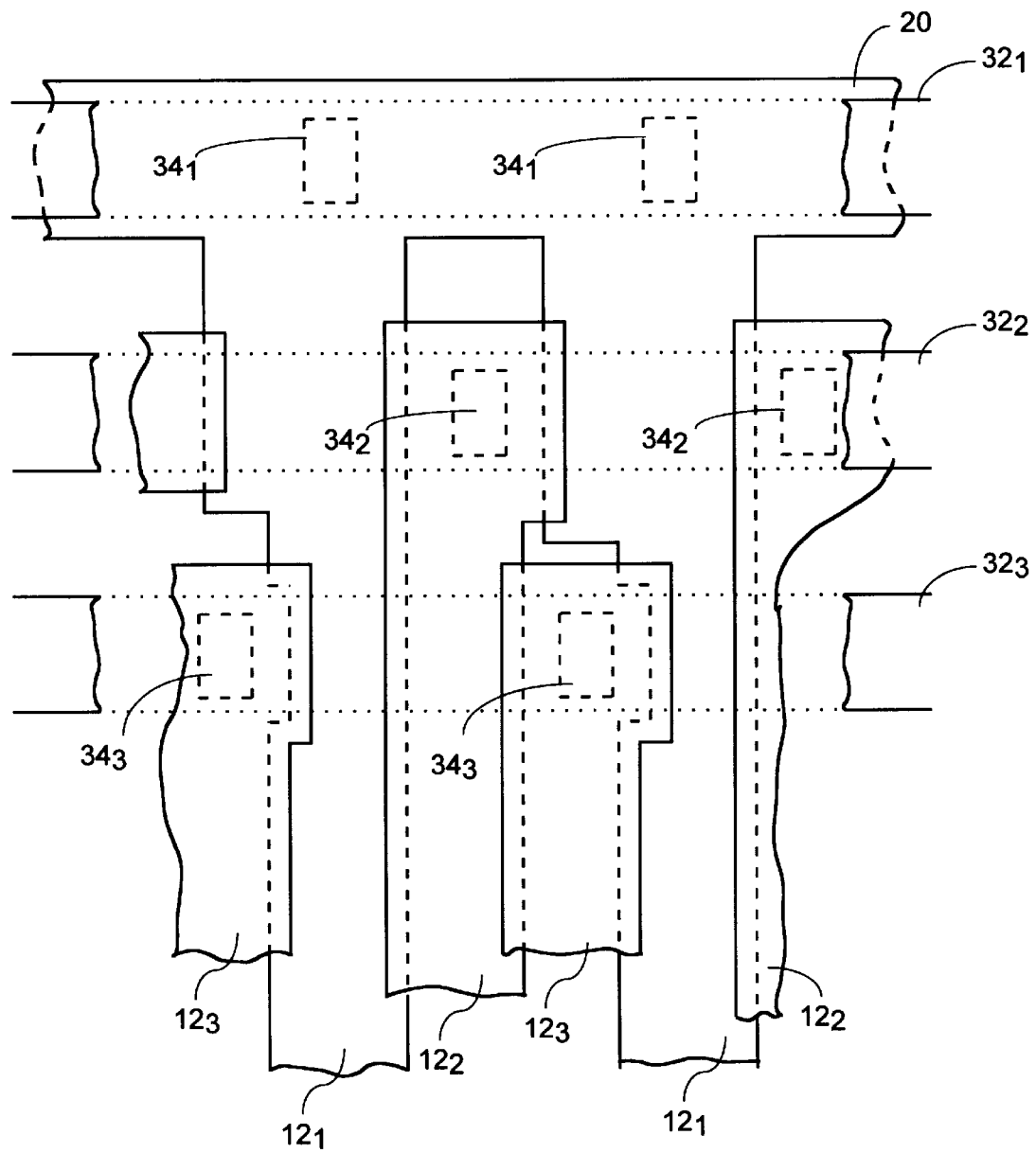
FIG. 4 is a top plan view of the CCD in accordance with the prior art at a later stage in fabrication in order to illustrate the arrangement of gate electrodes.
Figure 5:
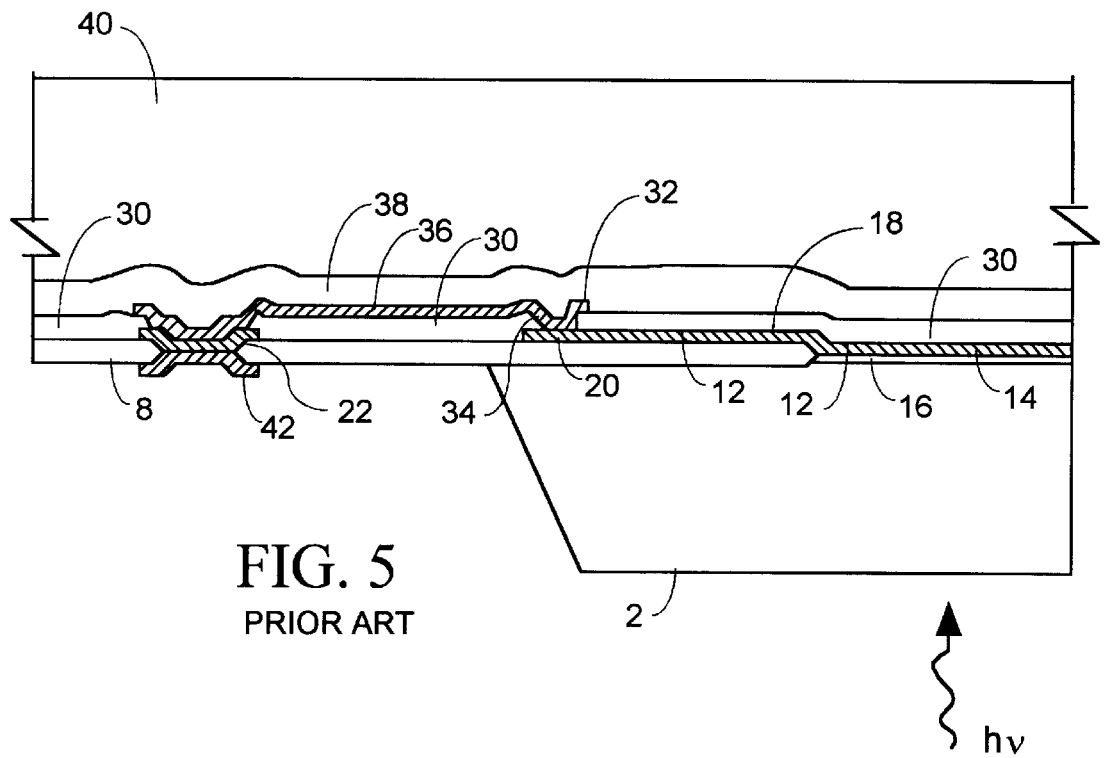
FIG. 5 is a sectional view of the completed CCD.
Figure 6:
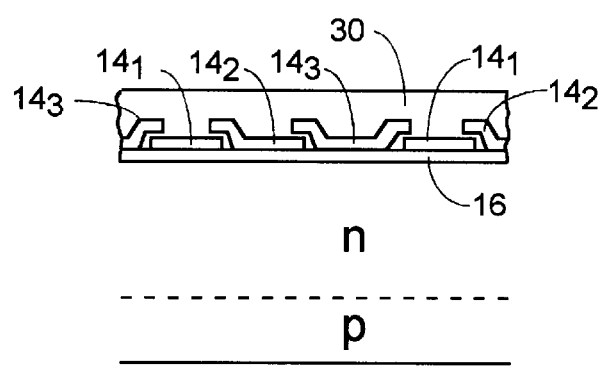
FIG. 6 is a further sectional view taken at right angles to FIG. 5.

Referring to FIGS. 1 and 2, when the field oxide 8 is formed, the front side of the die is masked not only over the active region of the device but also over at least three strips, such that three slot-form apertures $60_1$, $60_2$ and $60_3$ are defined in the field oxide. Preferably, the three apertures are parallel to each other. The aperture $60_1$ is closest to the active region of the device but is outside the periphery of the eventual silicon plateau 2'. The aperture $60_2$ is between the apertures $60_1$ and $60_3$. There is a thin layer of gate oxide over the die in the active region 4 and in the apertures 60.

The first level polysilicon is patterned to define gate electrodes $62_1$ extending over the active region, a first level polysilicon bus $64_1$ extending over the slot-form aperture $60_1$ in the field oxide and gate extensions $66_1$ connecting the gate electrodes $62_1$ to the first level polysilicon bus $64_1$. Similarly, the second level polysilicon forms gate electrodes $62_2$, a second level polysilicon bus $64_2$ extending over the slotform aperture $60_2$ and gate extensions $66_2$ connecting the gate electrodes $62_2$ to the second level polysilicon bus $64_2$. The third level polysilicon forms gate electrodes $62_3$, a polysilicon bus $64_3$ over the slot-form aperture $60_3$ and gate extensions $66_3$ connecting the gate electrodes $62_3$ to the third level polysilicon bus $64_3$.

As in the case of the device described with reference to FIGS. 3–6, an interface layer 38 is deposited over the polysilicon layers after doping and a borosilicate glass support 40 is formed over the interface layer. The borosilicate glass support may be formed in the manner described in U.S. Pat. No. 4,946,716.

After the die has been attached to the support 40, it is thinned from the back side and the plateau 2' is defined, exposing the plain of field oxide 8 around the plateau and the thin gate oxide in the slot-form apertures 60. The gate oxide is removed, exposing the polysilicon buses 64 through the apertures 60. A layer of metal is deposited over the back side of the field oxide and is patterned to define metal buses 68 which extend along the apertures 60 and make electrical contact to the polysilicon buses 64 respectively through the apertures, bond pads 72 at the periphery of the structure, for wire bonding to external circuitry, and connection branches 70 connecting the buses 68 to the bond pads 72.

Each level of polysilicon is doped before it is covered by a subsequent level of polysilicon or is otherwise masked, and consequently although the gate extensions $66_3$ partially mask the first and second level polysilicon buses $64_1$ and $64_2$ and the gate extensions $66_2$ partially mask the first level polysilicon bus $64_1$, the buses $64_1$ and $64_2$ are nevertheless electrically continuous. Since each level of polysilicon is doped before it is masked, the level of a polysilicon bus does not constrain its position relative to the other buses as a function of distance from the active region. Therefore, although in FIGS. 1 and 2 the relative level of each bus is the same as its relative position as a function of distance from the active region, the relative positions could be changed without impairing the operation of the clocking electrode structure.

In the case shown in FIGS. 1 and 2, in which the relative level of each bus is the same as its relative position as a function of distance from the active region, the second level polysilicon bus $64_2$ does not mask the gate extensions $66_1$ of the first level polysilicon and the third level polysilicon bus $64_3$ does not mask the gate extensions $66_1$ or $66_2$ of the first or second level polysilicon. Further, although the gate extensions $66_2$ of the second level polysilicon partially mask the first level polysilicon bus $64_1$, and the gate extensions $66_3$ of the third level partially mask the first and second level polysilicon buses $64_1$ and $64_2$, each polysilicon bus 64 is connected to the corresponding metal bus 68 over its entire length and therefore each polysilicon bus is electrically continuous. Therefore, if the three levels of polysilicon were all doped after the third level had been deposited and patterned, each level of polysilicon would be electrically continuous. The gate electrodes and gate extension of the first level polysilicon are partially covered by the second and third level polysilicon, but there is no length segment of the first level polysilicon gate electrode or gate extension that is completely covered across its entire width by the second or third level polysilicon, and accordingly the gate extensions and the gate electrodes are electrically continuous. Similarly, the gate extensions and the gate electrodes of the second level polysilicon are electrically continuous.

Because the metal buses are formed after the glass ceramic substrate has been applied to the front side of the device, it is not necessary that the metal be able to withstand the high temperatures involved in applying the interface layer and the glass ceramic substrate. Consequently, it is not necessary to employ a refractory metal for the metal buses, and aluminum can be used instead.

Since the polysilicon buses are located outside the periphery of the silicon plateau, where a continuous aluminum bus can be formed on the back side of the field oxide after the thinning operation, the need to provide a bus of refractory metal and a conductor run of refractory metal connecting the bus to the bond pad at the periphery of the device is avoided. Since aluminum has much lower sheet resistivity than the refractory metal employed in the device according to the prior art, it is possible to drive the gates at a higher clock rate without encountering problems due to the path length from the bond pad to the gates or due to differences in path length from the pads to the gates for the different phases.

Polysilicon is used for the gate electrodes because it is able to withstand processing temperatures and the necessary insulation between a lower level gate electrode and an upper level gate electrode can be provided simply by oxidizing a surface layer of the lower level gate electrode. However, the sheet resistivity of polysilicon is about 20 ohms per square whereas the sheet resistivity of a refractory metal may be about 5 ohms per square. Therefore, it may be desirable to use refractory metal instead of polysilicon for the gate extensions 66 and the buses 64.

It will be appreciated that the invention is not restricted to the particular embodiment that has been described, and that variations may be made therein without departing from the scope of the invention as defined in the appended claims and equivalents thereof. For example, although the aperture $60_2$ is shown as being continuous, so that there is electrical connection between the polysilicon bus $64_2$ and the metal bus $68_2$ at all positions along the aperture $60_2$, the aperture could alternatively be composed of discrete spaced segments, so long as the spaces between segments did not overlap significantly with the portions that are masked by the gate extensions $66_3$, since in each case the polysilicon bus $64_2$ would be electrically continuous. Further, it may not be necessary to provide polysilicon buses on the front side of the field oxide if reliable electrical contact can be assured between the gate extensions 66 and the metal buses 68. Although the invention has been described with reference to a thinned three-phase CCD, the invention is not restricted to devices of this nature. Specifically, in the case of a CCD, the invention is not restricted to the CCD being a three-phase device. Moreover, the invention is applicble to devices other than CCDS, such as clock drivers and address drivers.

We claim:

1. An intermediate structure in fabrication of an integrated circuit device, said intermediate structure comprising:
   a semiconductor die having front and back sides and incorporating an active region subjacent the front side and within a boundary on the front side of the die, there being a field region of the front side of the die adjacent the active region,
   a first level electrode structure and a first level bus over the front side of the die, wherein the first level electrode structure extends over the active region of the die and the first level bus extends over the field region of the front side of the die, and
   a second level electrode structure and a second level bus over the front side of the die, wherein the second level electrode structure extends over the active region of the die and the second level bus extends over the field region of the front side of the die.

2. A structure according to claim 1, wherein the second level bus includes a second level interconnect means which is connected to the second level electrode structure and crosses the first level bus.

3. A structure according to claim 1, further comprising a third level electrode structure and a third level bus over the front side of the die, wherein the third level electrode structure extends over the active region of the die and the third level bus extends over the field region of the front side of the die.

4. A structure according to claim 3, wherein the third level bus includes a third level interconnect means which is connected to the third level electrode structure and crosses the first and second level buses.

5. A structure according to claim 1, wherein the semiconductor die includes a layer of field oxide at the front side of the die surrounding the active region and the field oxide is formed with at least two slot-form apertures over which the first level bus and the second level bus respectively extend, each bus extending over substantially the entire length of the respective aperture.

6. A structure according to claim 5, further comprising a first metal bus on the back side of the layer of field oxide and in electrically conductive contact with the first level bus over substantially the entire length of the first aperture, and a second metal bus on the back side of the field oxide and in electrically conductive contact with the second level bus over substantially the entire length of the second aperture.

7. A structure according to claim 6, wherein the first level bus and the second level bus are made of polysilicon and the first metal bus and the second metal bus are made of aluminum.

8. A structure according to claim 1, wherein the active region of the substrate is in a plateau and the first and second level buses are outside the plateau.

9. An integrated circuit device structure comprising:
   a semiconductor plateau having front and back sides and containing an active region subjacent the front side,
   an insulating layer surrounding the semiconductor plateau at the front side of the plateau and having a front side and a back side and being formed with at least first and second elongate apertures,
   a first level electrode structure at the front side of the plateau,
   a first level bus at the front side of the insulating layer and connected to the first level electrode structure, the first level bus extending over the first elongate aperture,
   a second level electrode structure at the front side of the plateau,
   a second level bus at the front side of the insulating layer and connected to the second level electrode structure, the second level bus extending over the second elongate aperture,
   a first metal bus at the back side of the insulating layer and connected to the first level bus through the first aperture over substantially the entire length of the first level bus, and
   a second metal bus at the back side of the insulating layer and connected to the second level bus through the second aperture over substantially the entire length of the second level bus.

10. An integrated circuit device structure comprising:
    a semiconductor plateau having front and back sides and containing an active region subjacent the front side,
    an insulating layer surrounding the semiconductor plateau at the front side of the plateau and having a front side and a back side and being formed with at least one elongate aperture,
    an electrode structure at the front side of the plateau,
    a front side bus at the front side of the insulating layer and connected to the electrode structure, the front side bus extending over the elongate aperture, and
    a back side bus at the back side of the insulating layer and connected to the front side bus through the aperture over substantially the entire length of the front side bus.

* * * * *